United States Patent [19]
Mahon et al.

[11] Patent Number: 5,552,335
[45] Date of Patent: Sep. 3, 1996

[54] ACOUSTIC CHARGE TRANSPORT INTEGRATED CIRCUIT PROCESS

[75] Inventors: Steven S. Mahon; Martin J. Brophy, both of Urbana; Michael J. Hoskins, Mahomet, all of Ill.

[73] Assignee: Electronic Decisions, Inc., Urbana, Ill.

[21] Appl. No.: 676,967

[22] Filed: Mar. 29, 1991

[51] Int. Cl.$^6$ .................................................. H01L 21/70
[52] U.S. Cl. .................. 437/53; 437/73; 437/90
[58] Field of Search ................. 437/53, 73, 90

[56] References Cited

U.S. PATENT DOCUMENTS

| | | | |
|---|---|---|---|
| 4,124,826 | 11/1978 | Dixon et al. | 437/24 |
| 4,290,825 | 9/1981 | Dearnaley et al. | 437/24 |
| 4,393,180 | 7/1983 | Dearnaley et al. | 437/24 |
| 4,539,743 | 9/1985 | Anthony et al. | 437/22 |

*Primary Examiner*—Peter A. Nelson
*Attorney, Agent, or Firm*—Shlesinger Arkwright & Garvey

[57] ABSTRACT

A process for fabricating an acoustic charge transport (ACT) integrated circuit, comprises the steps of providing a semi-insulating wafer; providing an epitaxial layer with a thickness and carrier concentration appropriate for an ACT device on the semi-insulating wafer; providing at least one circuit element semiconductor layer on the surface of the epitaxial layer for construction of an integrated circuit element, the at least one semiconductor layer having a thickness substantially less than the thickness of the ACT epitaxial layer and having a carrier concentration substantially greater than the ACT epitaxial layer; removing lateral conductivity of the entire ACT epitaxial layer except in the regions associated with the at least one circuit element semiconductor layer and the ACT device in order to achieve lateral electrical isolation between the circuit element semiconductor layer and the ACT device; providing ohmic contacts on the at least one layer and on the ACT device; providing a first metal layer on selected areas on the at least one layer and the ACT device; rendering semi-insulating the epitaxial layer underneath the at least one layer to provide significant vertical electrical isolation with minimal detrimental effect on the electrical characteristics of the circuit element to be constructed on the semiconductor layer; and providing at least one layer of dielectric material on the wafer; and providing at least a second metal layer connected at selected areas to the first metal layer.

30 Claims, 13 Drawing Sheets

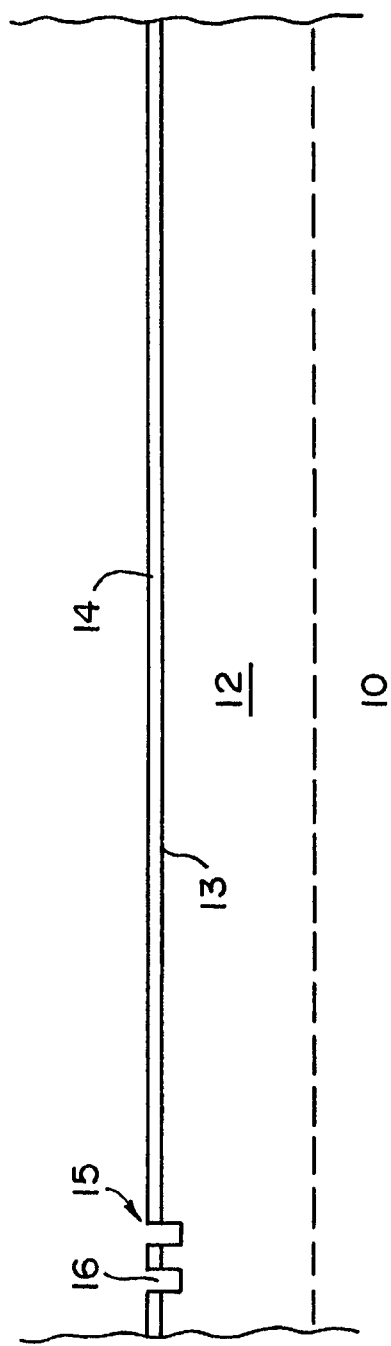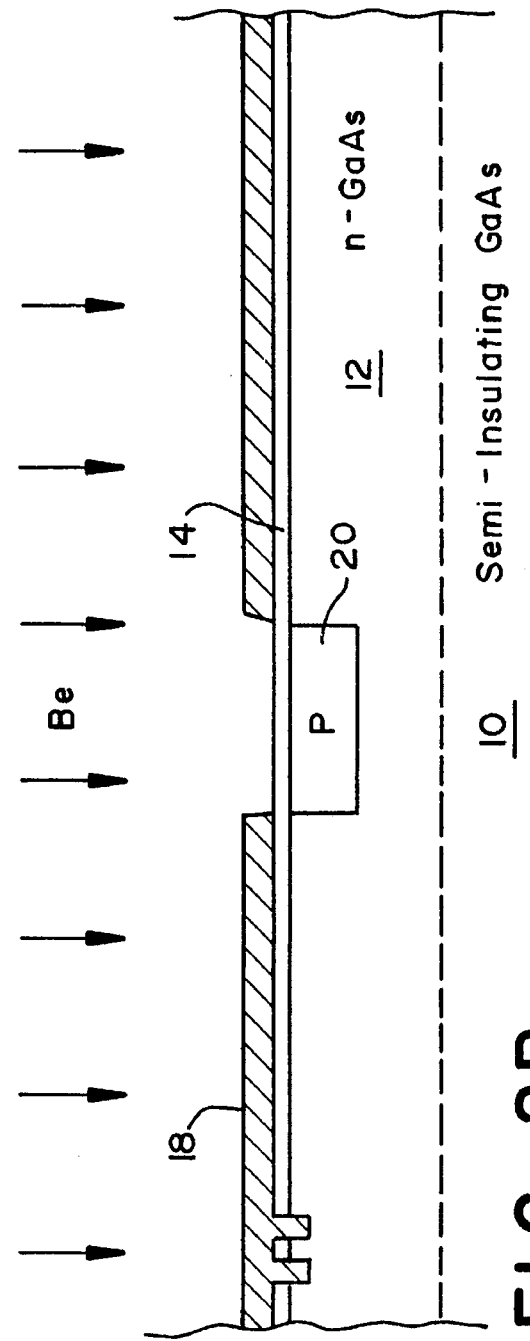

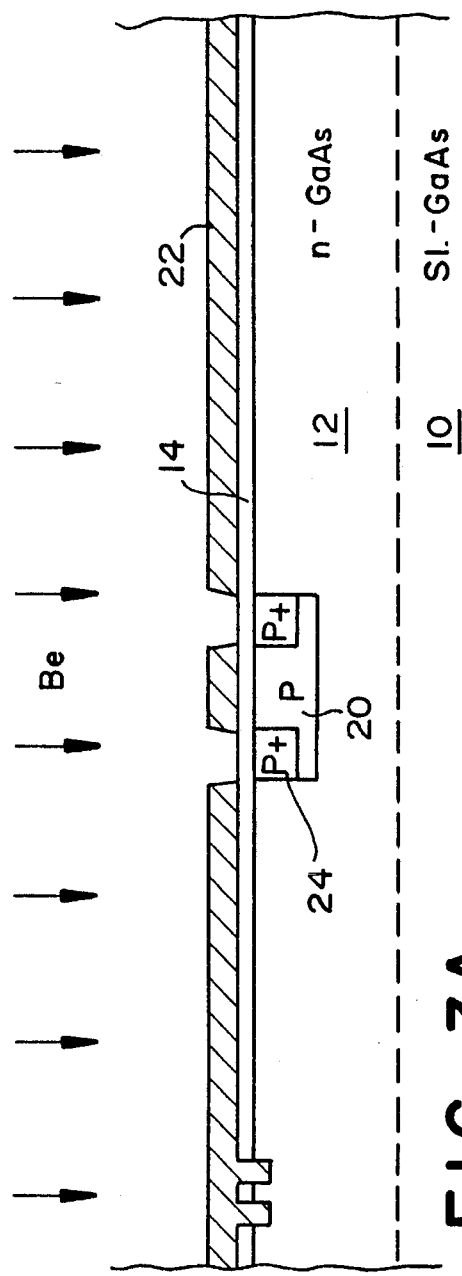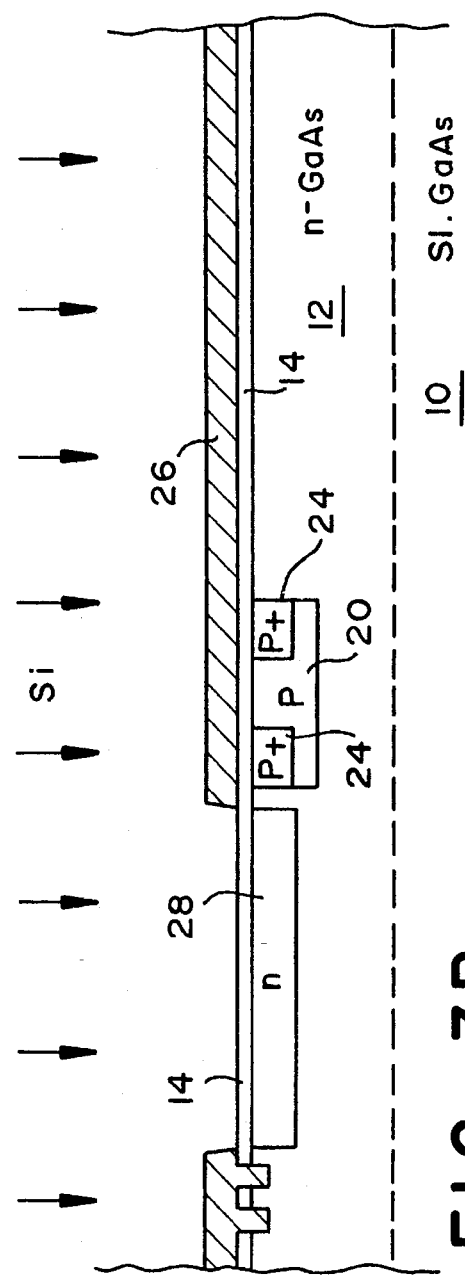

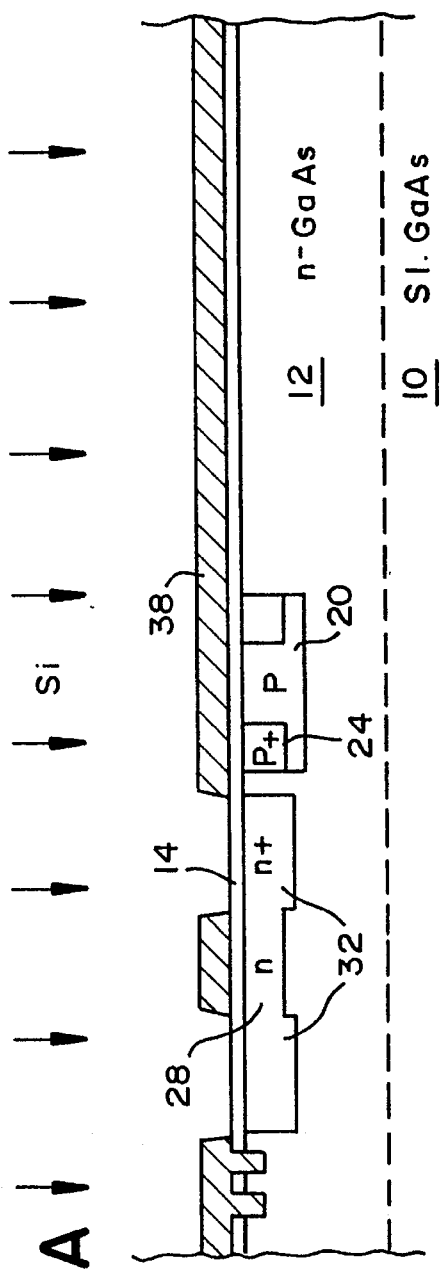
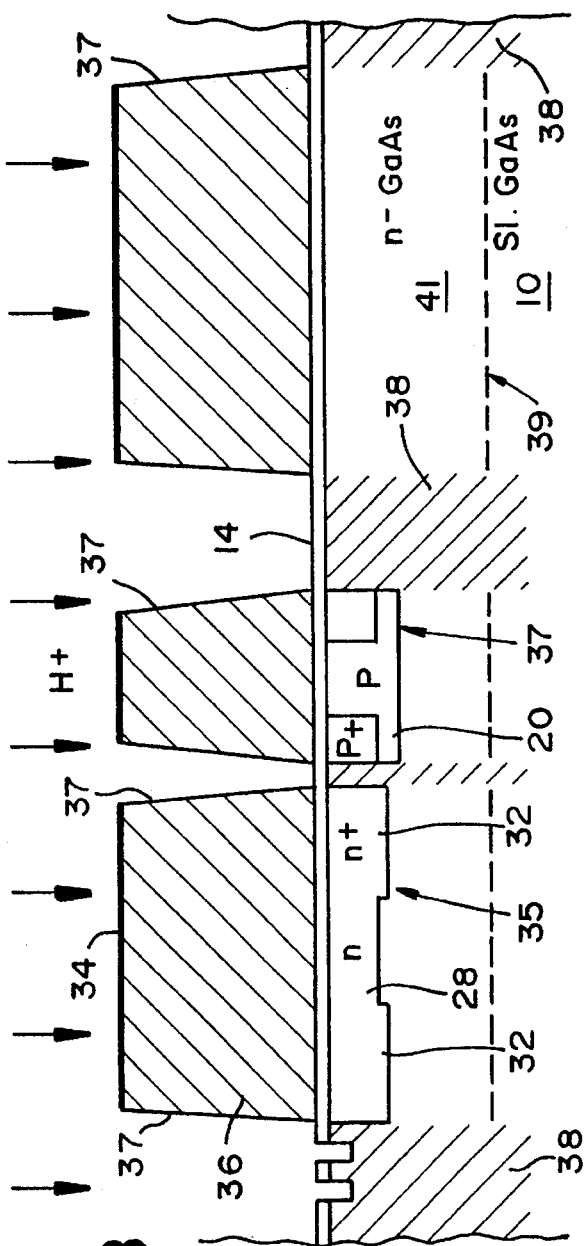
FIG. 4A
FIG. 4B

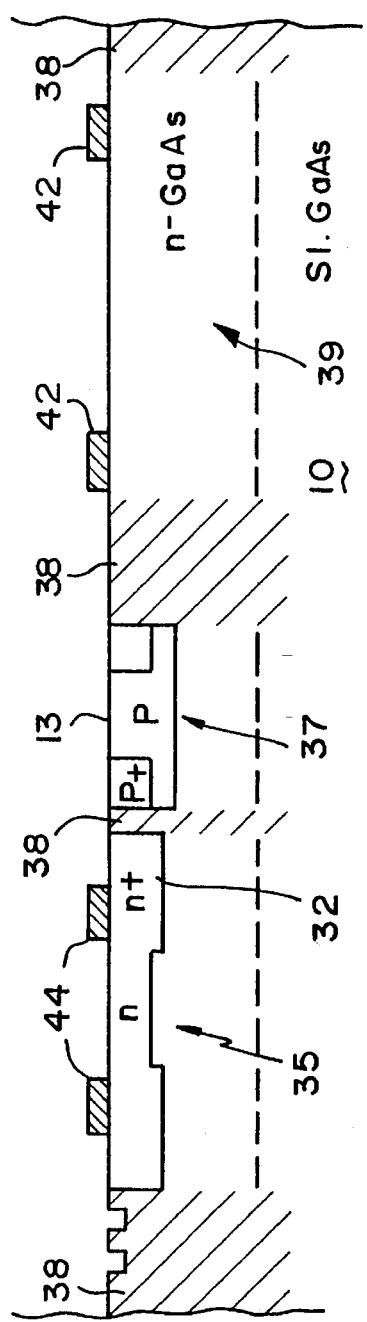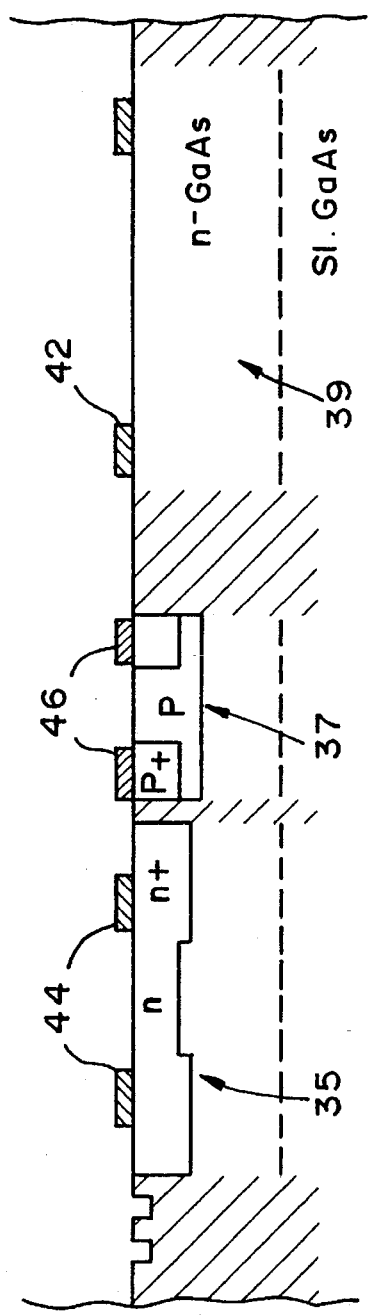

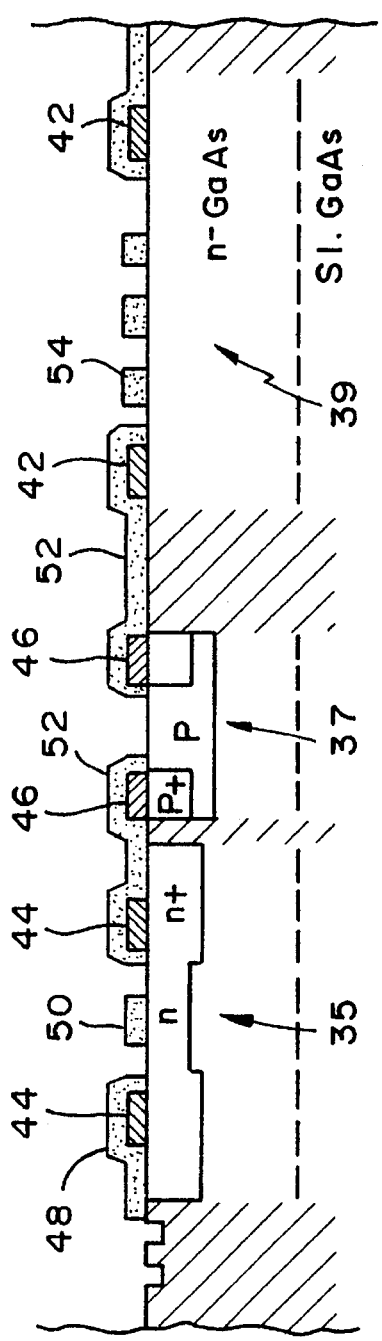
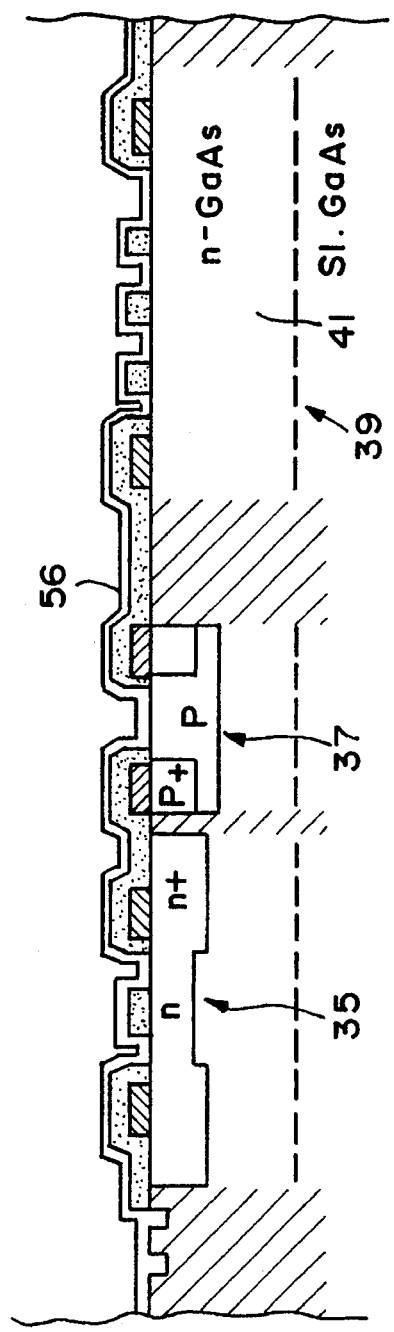
FIG. 6A
FIG. 6B

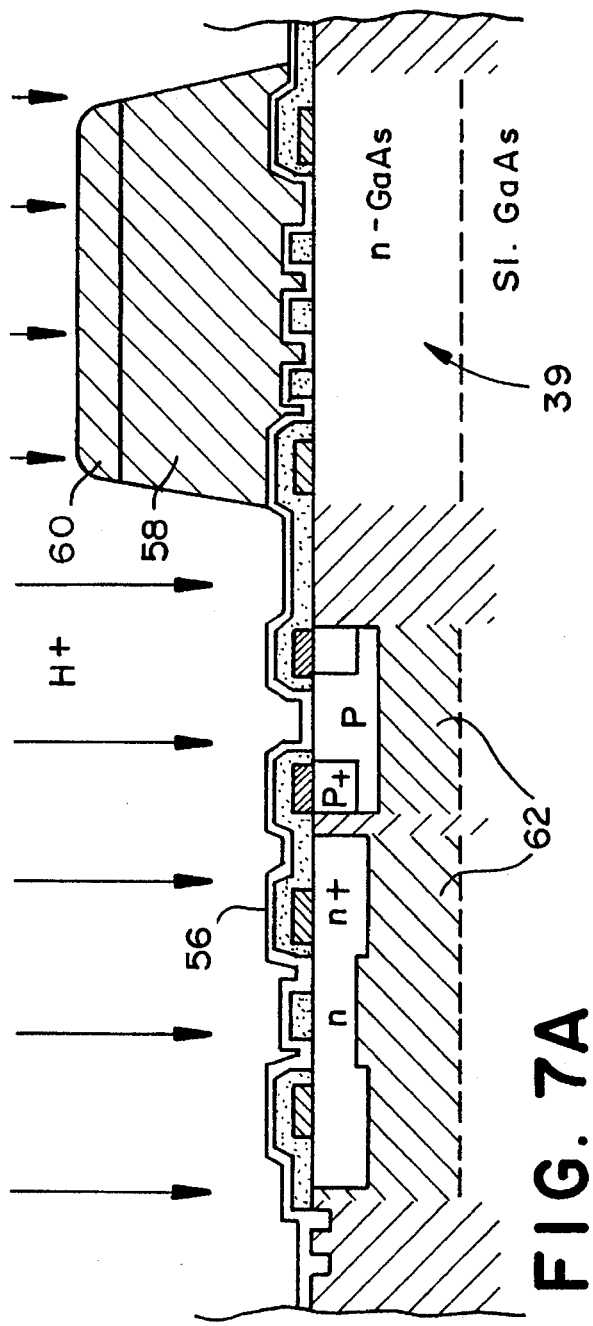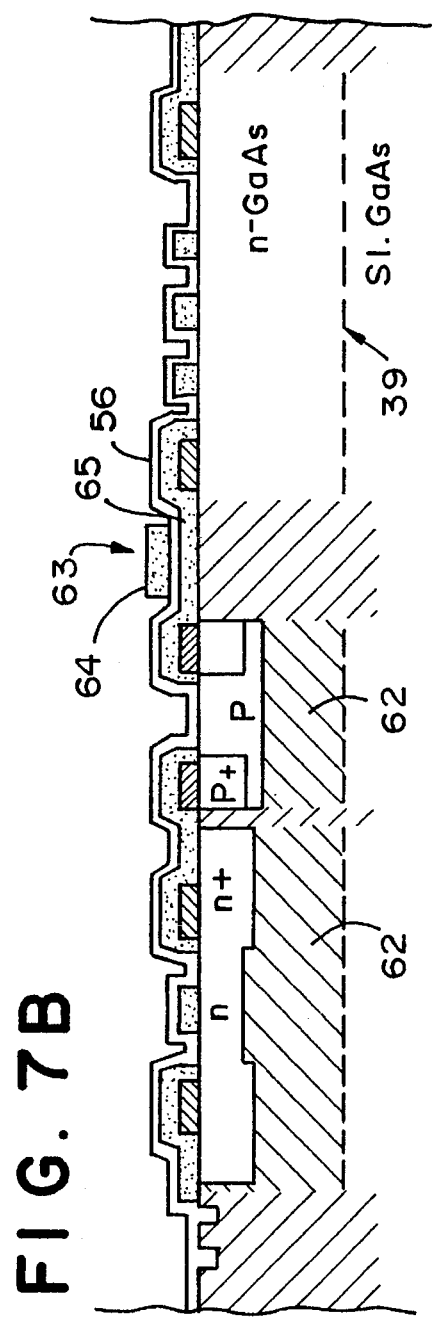
FIG. 7A
FIG. 7B

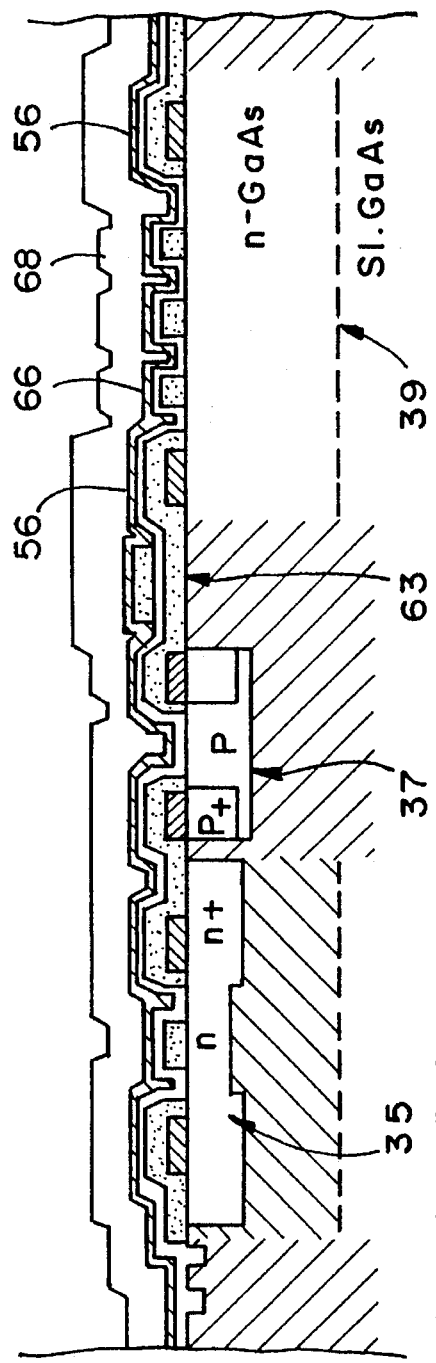
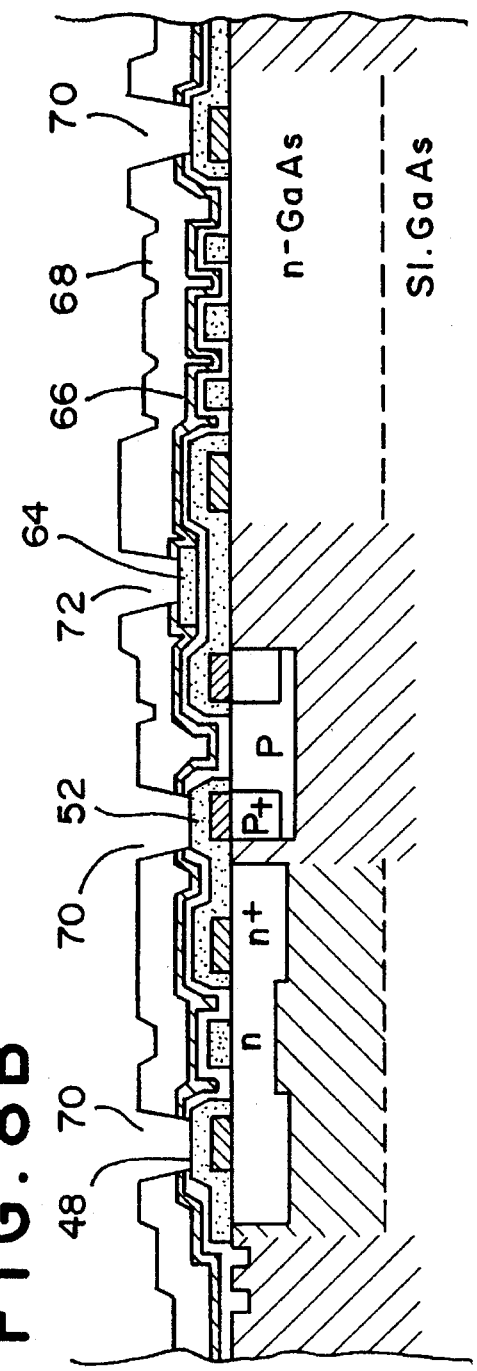
FIG. 8A
FIG. 8B

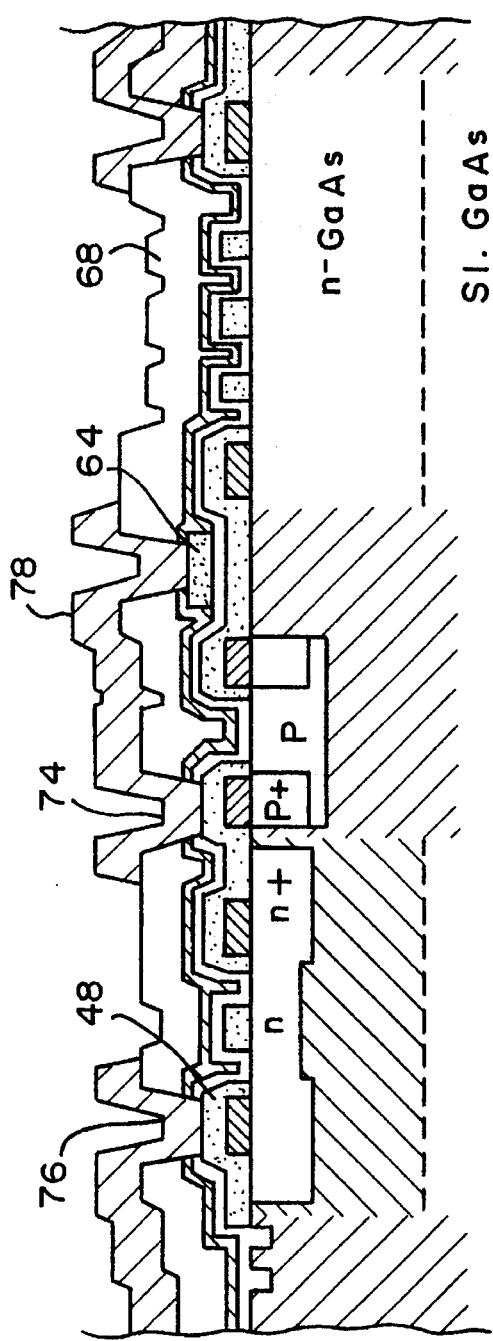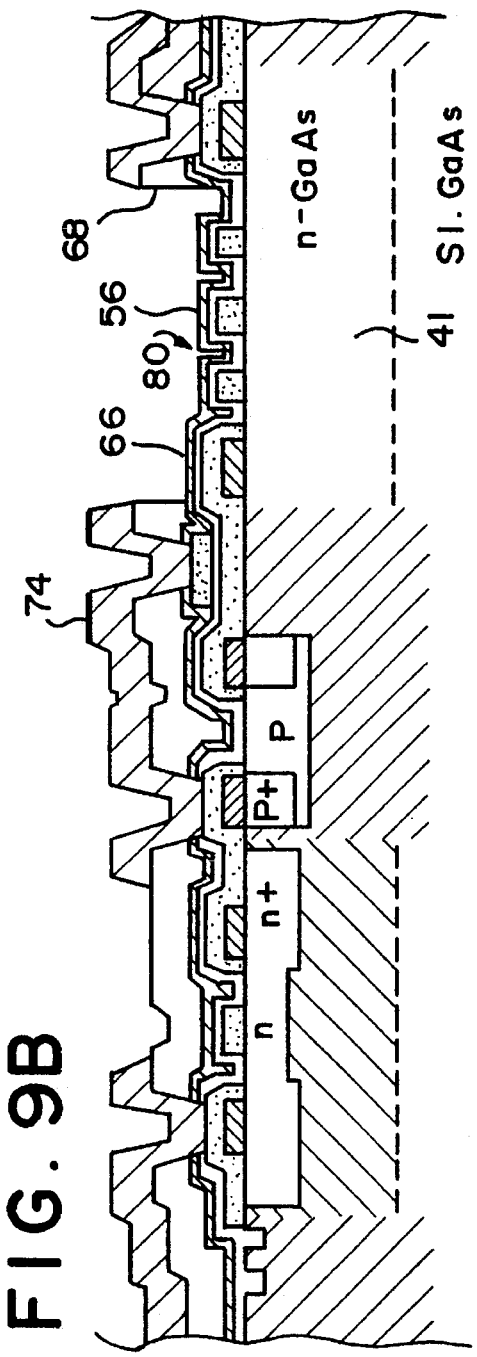
FIG. 9A
FIG. 9B

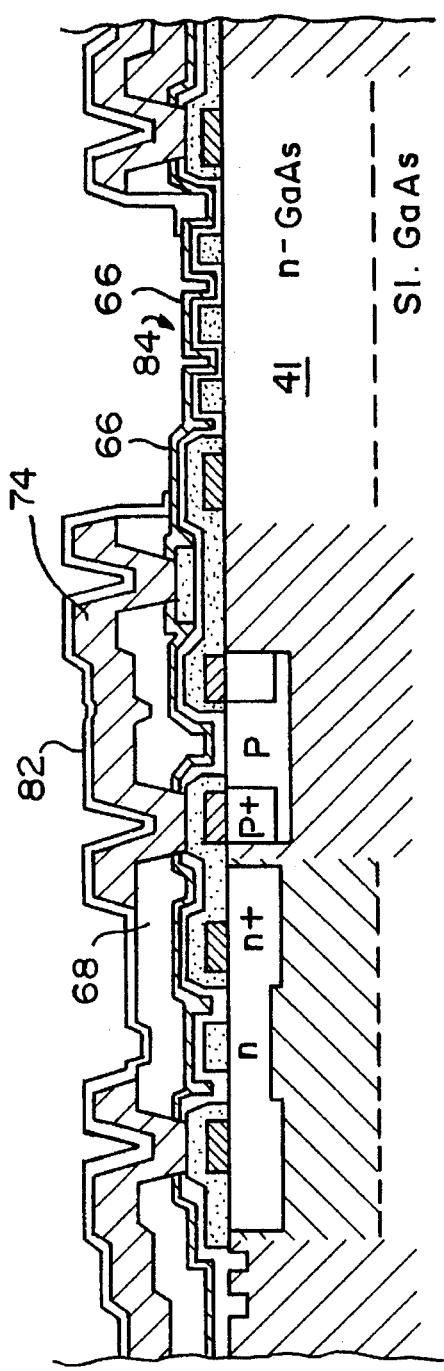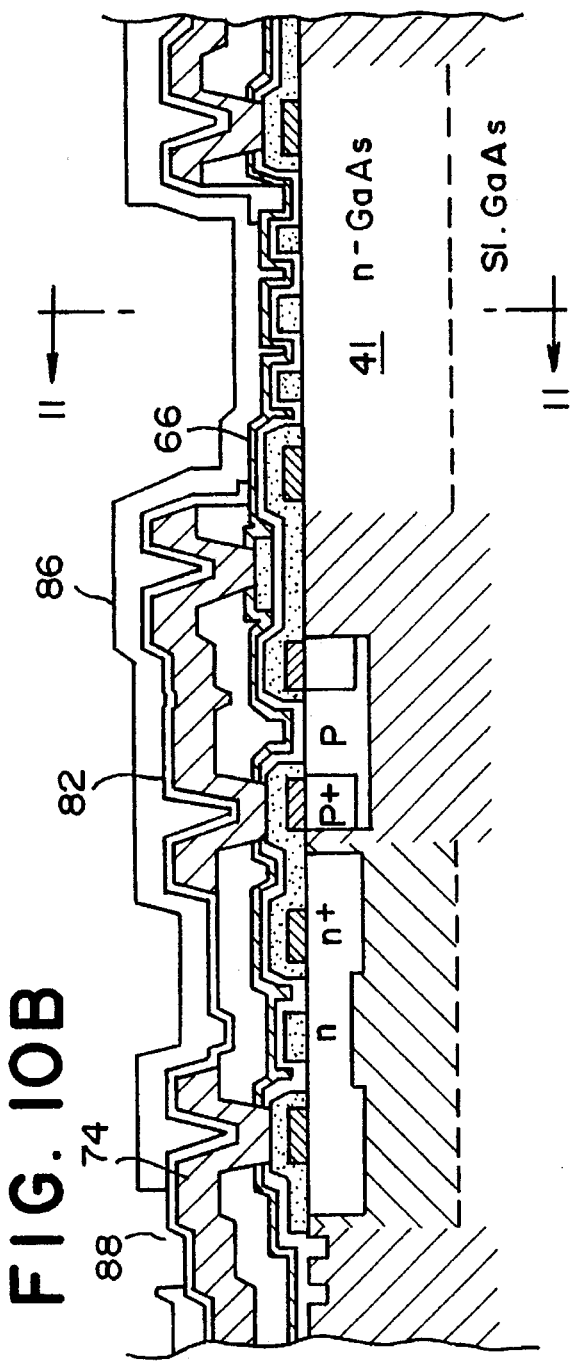
FIG. 10A
FIG. 10B

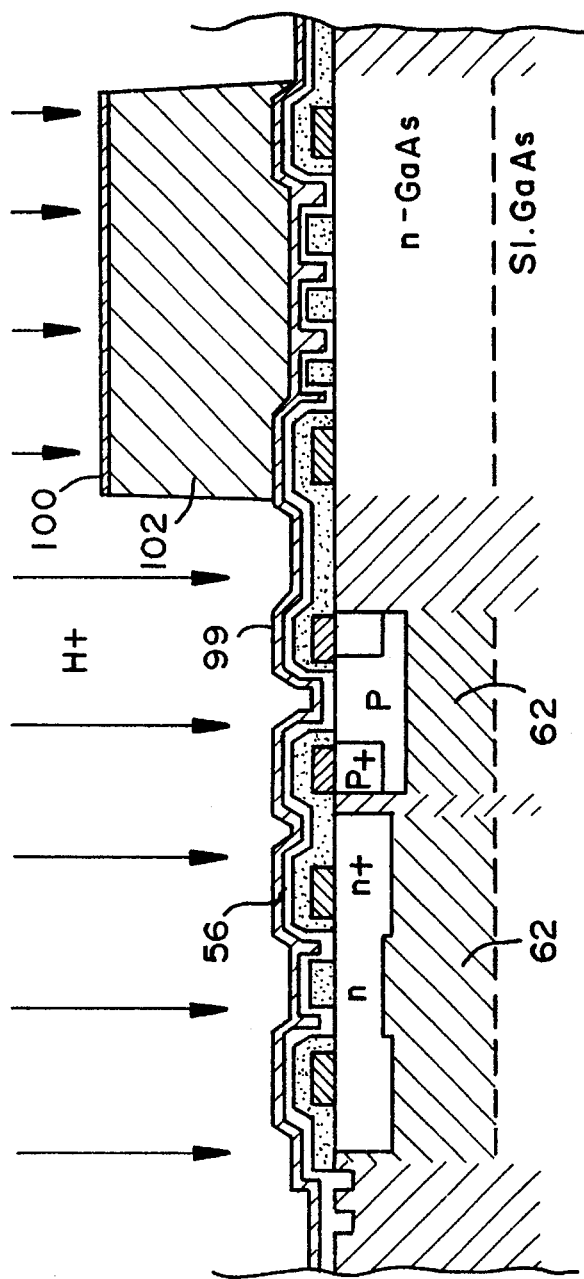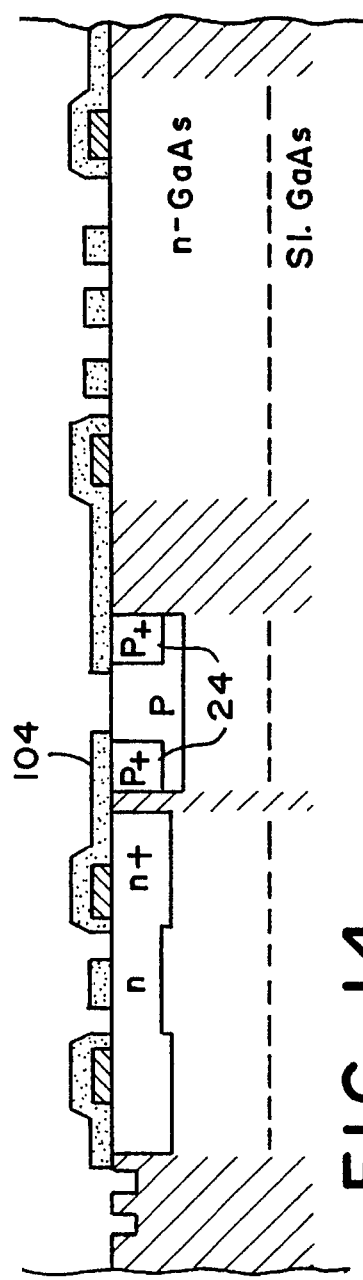

5,552,335

ACOUSTIC CHARGE TRANSPORT INTEGRATED CIRCUIT PROCESS

FIELD OF THE INVENTION

This invention was made with Government support under contract number F-30602-85-C-0170 awarded by the Department of Defense. The Government has certain rights in this invention.

The present invention relates generally to an acoustic charge transport device and particularly to a process for fabricating an ACT device with ancillary monolithically integrated active and passive circuit elements on the same ACT chip, The present invention is related to copending application entitled "Soft Proton Isolation Process for an Acoustic Charge Transport Integrated Circuit", filed on Mar. 29, 1991, whose disclosure is hereby incorporated. The present invention is also related to copending application Ser. No. 07/180, 775, filed on Apr. 12, 1988, entitled "Integrated Circuit Element, Methods of Fabrication and Utilization," whose disclosure is hereby incorporated.

BACKGROUND OF THE INVENTION

The unique epitaxial layer characteristics needed for an acoustic charge transport (ACT) device operation must be preserved throughout the course of fabricating integrated circuit elements on the epitaxial layer. This represents a clear and critical distinction between an ACT integrated circuit (ACTIC) and a conventional GaAs integrated circuit fabricated on epitaxial wafers.

In the conventional gallium arsenide integrated circuit fabrication, epitaxial material is used solely as a high-purity substrate for the subsequent introduction of active layers, e.g. by ion implantation, and plays no role in the operation of produced device. In this case, preservation of the characteristics of the starting material is not likely to occur and is furthermore irrelevant. On the other hand, in an ACTIC, the epitaxial material is an active component of the device, and must not be deleteriously affected by the processing required to produce ancillary circuit elements. Moreover, standard gallium arsenide (GaAs) processing will not work in an ACTIC because of the active nature of the epitaxial material, and because of the special requirements of the ACT device which is at the core of the ACTIC.

OBJECTS AND SUMMARY OF THE INVENTION

It is an object of the present invention to provide an integrated circuit process to create high performance analog signal processors by integrating acoustic charge transport (ACT) devices with dense arrays of conventional electronic components such as metal semiconductor field effect transistors (MESFETs), Schottky barrier diodes, metal-insulator-metal (MIM) capacitors and implanted resistors. The process creates a unique version of a MESFET called an IFET (isolated field effect transistor) that performs similarly to a conventional GaAs MESFET but is compatible with ACT epitaxial starting material. This integrated structure is referred to as an acoustic charge transport integrated circuit (ACTIC).

It is another object of the present invention to provide fabrication processes for the special requirements of the ACT device, such as acoustic waveguides and absorbers.

It is still another object of the present invention to provide means for fabricating the standard integrated circuit elements on very non-standard, as well as electrically active, epitaxial GaAs material.

It is yet another object of the present invention to provide means to fabricate an ACT device without harm to the integrated circuit elements and to fabricate the circuit elements without harm to the ACT device.

It is another object of the present invention to provide fabrication processes for producing a three-velocity surface acoustic wave waveguide by exploiting the acoustic parameters of dielectric layers, some of which are also needed for integrated circuit purposes, and a method for using the fabrication step needed to define implant alignment reference marks (needed for the integrated circuit elements) to produce surface acoustic wave absorbers for the ACT device.

The present invention advantageously exploits the depth dependence of carrier removal by low dose, high energy proton irradiation to selectively remove the electrically active ACT epitaxial layer from regions of the device while minimally affecting the more highly doped active layers introduced in those regions for integrated circuit elements. This allows the integrated circuit elements to be produced with standard techniques of microcircuit fabrication with electrical isolation from the active ACT epitaxial layer beneath them.

At the same time, high energy implant masking techniques are used to protect the epitaxial layers from carrier loss due to the proton irradiation in regions of the integrated circuit occupied by the ACT device. In addition, special fabrication processes are applied to ensure that the ACT epitaxial layer is not destroyed by the high temperature anneal required to activate the implanted layers used to form the integrated circuit elements.

These and other objects of the present invention will become apparent from the following detailed description.

BRIEF DESCRIPTIONS OF THE DRAWINGS

FIG. 2A is a cross-sectional view of an ACT epitaxial layer showing a silicon nitride cap layer and fiducial.

FIG. 2B is a cross-sectional view showing a photoresist p-resistor patterning on the silicon nitride cap.

FIG. 3A is a cross-sectional view showing a photoresist patterning for the p+ implant mask on the silicon nitride cap.

FIG. 3B is a cross-sectional view showing a photoresist implant mask for the n-channel implant on the silicon nitride cap.

FIG. 4A is a cross-sectional view showing a photoresist patterning for the n+ implant mask on the silicon nitride cap.

FIG. 4B is a cross-sectional view showing a patterned polyimide film on top of the silicon nitride cap being subjected to hard proton implant.

FIG. 5A is a cross-sectional view showing a deposition of the n-type ohmic contact metal structure.

FIG. 5B is a cross-sectional view showing a deposition of the p-ohmic metal structure.

FIG. 6A is a cross-sectional view showing a deposition of the Schottky metal structure.

FIG. 6B is a cross-sectional view showing a plasma enhanced chemical vapor deposition (PECVD) silicon nitride layer for the capacitor dielectric.

FIG. 7A is a cross-sectional view showing a proton mask of patterned polyimide layer on top of the silicon nitride capacitor dielectric for soft proton implant.

FIG. 7B is a cross-sectional view showing a deposition of the top capacitor metal.

FIG. 8A is a cross-sectional view showing a two level deposition of intermetal dielectrics.

FIG. 8B is a cross-sectional view showing etched via holes on the intermetal dielectrics.

FIG. 9A is a cross-sectional view showing deposition and etch of the metal 2 layer.

FIG. 9B is a cross-sectional view showing removal of the silicon nitride in the ACT device channel.

FIG. 10A is a cross-sectional view showing a deposition of a silicon nitride layer to serve as one dielectric for the SAW waveguide.

FIG. 10B is a cross-sectional view showing deposition of a silicon nitride layer to serve as the final device passivation and bond pad etch.

FIG. 13 is a cross-sectional view showing a high resolution soft proton isolation.

FIG. 14 is a cross-sectional view showing another embodiment of the p-resistor structure that eliminates the need for a p-ohmic metalization.

DETAILED DESCRIPTION OF THE INVENTION

The fabrication process of the present invention is disclosed in FIGS. 2 through 10, which are process cross-sections through the applicable portions of the integrated circuit under construction using a particular embodiment of the invention. In these figures, the acoustic charge transport (ACT) section of the acoustic charge transport integrated circuit (ACTIC) will be developed on the right, with the surface acoustic wave (SAW) propagating from right to left. Three integrated circuit elements, an isolated field effect transistor (IFET), a p-resistor and a metal-insulator-metal (MIM) capacitor, as a way of an example, will be developed from left to right, respectively. These diagrams are designed to show, step by step, how this complex process elegantly produces many different integrated circuit elements. However, these elements are only shown by way of example and are not intended to represent the elements in an actual configuration of a functional circuit. The processes disclosed herein may be used in fabricating an ACT programmable transversal filter, as disclosed in copending application Ser. No. 07/309,222, filed Feb. 13, 1989.

Figure 1:
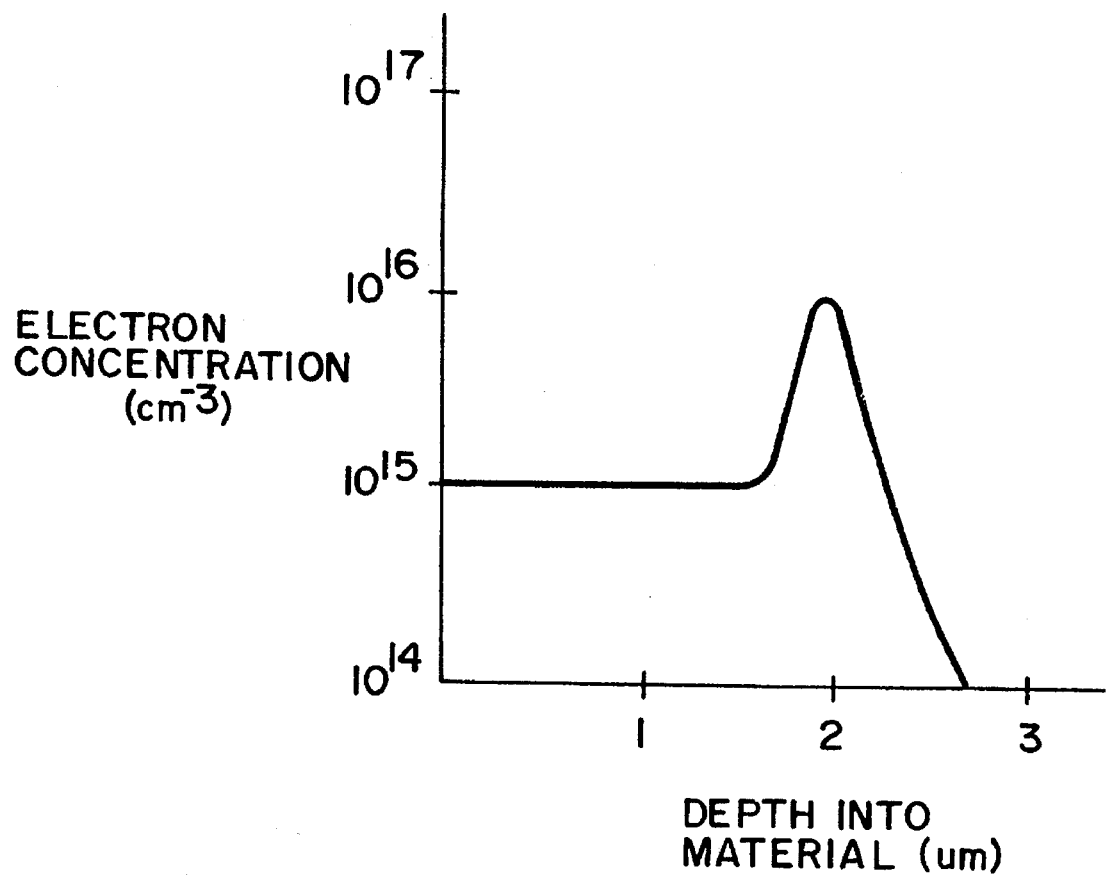
FIG. 1 is a plot of the electron concentration versus depth for a typical ACT epitaxial layer.

A semi-insulating GaAs wafer 10 with its epitaxially grown, lightly n-doped GaAs layer 12 is disclosed in FIG. 2. The unique carrier concentration of the epitaxial layer 12, as best shown in FIG. 1, needed for an ACT device operation, must be preserved throughout the course of fabricating integrated circuit elements on the epitaxial layer 12. The epitaxial layer 12 is prepared for fabrication by solvent cleaning its surface 13 followed by lightly etching the surface 13 (to a depth of about 50nm) in a 128:1:1 $H_2O:H_2SO_4:H_2O_2$ solution cooled to 0° C. This etch provides a stable, consistent surface, removing any contamination of the surface 13 from the epitaxial or post epitaxial processes.

A 100 nm silicon nitride cap layer 14 is deposited by conventional plasma enhanced chemical vapor deposition (PECVD) on the surface 13. The cap layer 14 is required to prevent degradation of the GaAs surface 13 during further thermal processing and prevents contamination from photolithographic processes that may come into contact with the GaAs surface 13.

A photolithographic process is used to define alignment fiducials 15 and an acoustic absorber structure. After photoresist patterning, vertical-wall grooves 16 are etched into the cap layer 14 and the epitaxial layer 12 with reactive ion etching (RIE). The RIE process comprises the removal of silicon nitride with a $CHF_3:O_2$ plasma followed by a GaAs etch using $CCl_2F_2$:Ar to a depth inversely proportional to the operating frequency of the ACT device. The RIE process is used because it provides a reproducible vertical etch profile without concern for the crystallographic orientation of the GaAs layer 12.

The etched groove structures 16 provide not only acoustic absorbers, but also the alignment markers 15 for subsequent photolithographic processes even after the silicon nitride cap layer 14 is removed. The alignment markers 15 are needed for the next 5 process steps that involve photolithographically defined ion implantations that leave no visual record of the process behind.

The next step, shown in FIG. 2B, is conventional photoresist patterning 18 of a p-resistor pattern on the silicon nitride cap layer 14. A 90 keV ion implant of Be+ (beryllium) at a dose between 1.5 and $6.0 \times 10^{12}/cm^2$ is done, using the photoresist patterning 18 as a mask. The Be+ penetrates the silicon nitride layer 14 to produce a p-doped layer 20 which provides a high value resistor element essential for circuit design within the ACTIC. Varying the implant dose can provide sheet resistances between 10 and 50 kOhm/$cm^2$. These high values result from the comparatively poor GaAs hole mobility, which is approximately 20 times lower than the electron mobility. Resistors with n-type doping could not reliably produce sheet resistances having the high values mentioned above. To finish this process step, the photoresist patterning 18 is removed using standard techniques.

Next, a high-dose p-type contact implant is used to provide highly doped tubs 24 for ohmic contact formation, as best shown in FIG. 3A. Conventional photoresist patterning 22 is provided on the silicon nitride cap layer 14 for the p+ implant mask. Again, a 90 keV ion implant of Be+ is used, this time at a dose of $3.0 \times 10^{13}/cm^2$.

After stripping the photoresist patterning 22, the first n-type implant is done. A photoresist implant mask 26 for the n-channel implant is provided on the silicon nitride cap layer 14, as best shown in FIG. 3B. A 120 keV ion implant of Si+ at a dose between 4.0 and $4.5 \times 10^{12}/cm^2$ penetrates the silicon nitride layer 14 to produce a n-doped layer 28. This shallow layer is used for an IFET channel. The mask 26 is removed by conventional techniques.

Next, new photoresist mask 38 is patterned for an n+ contact implant, as best shown in FIG. 4A. Bombardment of 180 keV Si+ at a dose of $2.8 \times 10^{13}/cm^2$ is used for this last active implant, producing a highly doped n-layer 32. The purpose of this layer 32 is to provide low contact resistance to the source and drain regions of the IFETs. The photoresist mask 38 is removed by standard techniques.

To activate the silicon and beryllium implants, a rapid thermal anneal (RTA) at 850° C. for 15 seconds in a 10:90 $H_2:N_2$ atmosphere is used. The time and temperature are selected to produce high and uniform implant activation without hurting the lightly doped epitaxial layer 12 needed for ACT operation. An RTA process is required to achieve the required temperature in a very short time. A typical anneal in a furnace would take many minutes to come up to temperature and to cool back down. The prolonged time of a furnace anneal will damage the ACT epitaxial layer 12 in most cases.

A 10 μm thick patterned polyimide film 36 disposed on top of the silicon nitride cap layer 14 is disclosed in FIG. 4B. The uniform film of polyimide 36 is spun on the layer 14 and is partially cured at a temperature of 180° C. Aluminum film 34 is then patterned on the polyimide layer 36 by using conventional lift-off photolithography. The aluminum film 36 acts as an inorganic etch mask when the polyimide layer 36 is patterned in an RIE process with an $O_2$ chemistry. The etch provides straight sidewalls 37 and the ability to pattern 3 um spaces in a 10 um film. The RIE process has an etch selectivity between the polyimide layer 36 and the silicon nitride layer 14 greater than 1000 to 1, so the thin silicon nitride layer 14 is not attacked even with an extended over-etch.

The next step is a 300 keV H+ implant at a dose of $1.0\times10^{14}/cm^2$, as best shown in FIG. 4B. The very thick polyimide layer 36 is needed to mask electrically active areas from this implant, because conventional mask materials, such as photoresist, do not have sufficient proton stopping power even at thicknesses considerably above 10 um. This implant, referred to as "hard proton isolation" (HPI), renders the exposed regions 38 of the conductive GaAs epitaxial layer 12 semi-insulating. These semi-insulating regions 38 exhibit electrical properties similar to the semi-insulating substrate 10. The HPI process provides the lateral electrical isolation between circuit elements which is required for any level of circuit integration. The electrical boundaries of an ACT channel 41 are completely defined by the HPI process at this point. After the implant, the mask is stripped in a hot KOH:$H_2O$ solution which consumes both the aluminum layer 34 and the polyimide layer 36.

At this point of the process, the structures of an IFET 35, a p-resistor 37 and the ACT device 39 areas are now identifiable.

The nitride cap layer 14 is then stripped using hydrofluoric acid followed by a $CF_4$:$O_2$ barrel plasma etch to expose the GaAs epitaxial layer surface 13, as best shown in FIG. 5A.

The deposition of n-type ohmic contact metal structures 44 and 42 is performed on the IFET 35 and the ACT device 39, respectively, patterned by conventional lift-off lithography. The deposition is done by sequential electron beam evaporation of 50 nm of Pd followed by 126 nm of Ge, done in one high vacuum pump-down. The thicknesses and selection of metalization are based on a compromise between low electrical contact resistance to the n+ layer 32 and low perturbation of surface acoustic waves (SAW) in the ACT device 39. The n-ohmics 42 provide contact both to the input and output terminals of the ACT device 39, while the n-ohmics 44 provide the n+ source and drain terminals of the IFET 35.

The deposition of the p-ohmic metal structure 46, patterned by conventional lift-off lithography, is disclosed in FIG. 5B. Metal deposition is done by sequential thermal or electron beam evaporation of 30 nm of Au, followed by 40 nm of Zn, and followed by 100 nm of Au done in one high vacuum pump-down. The p-ohmics 46 provide contact to the two ends of the p-resistor 37. This metalization is chosen to achieve low electrical resistance to the p-resistor 46 without generating excessive step heights.

After both n ohmics 42 and 44 and p-ohmics 46 are deposited, they are alloyed at 450° C. for 7 minutes in a 10:90 $H_2$:$N_2$ atmosphere.

A fundamental feature in most GaAs technologies is the creation of a metal-semiconductor contact that forms a rectifying rather than an ohmic contact. This is known as a Schottky barrier junction. The metal used to produce this junction will be referred to as Schottky metal. The same lift-off lithography, as in the ohmic processing, is used to deposit Schottky metal structures 48, 50, 52 and 54, as best shown in FIG. 6A. The deposition is done by sequential thermal or electron beam evaporation of 10 nm of Ti followed by 200 nm of 94.5:4.5 Al:Cu done in one high vacuum pump-down. The Schottky metalization serves as the first level of interconnect, which are contacts 48 to n-ohmics 44, gate electrode 50 for the IFET 39, contact 52 to the p-ohmics 46 and Schottky barrier electrodes 54 for the ACT device 39. The metalization is selected based on a compromise among high Schottky barrier height, low electrical resistance and low attenuation of the SAW.

A blanket deposition of a 100 nm PECVD silicon nitride layer 56 is provided to serve as the dielectric for a MIM capacitor, as best shown in FIG. 6B. The 100 nm thickness is preferably chosen to provide a large enough capacitance per unit area without producing excessive shorts from pinholes. The layer 56 also remains in the acoustic channel 41 of the ACT device 39 and must not adversely affect the acoustic propagation.

The next step is the elimination of the conductivity of the ACT epitaxial layer 12 under the integrated circuit elements by proton irradiation. A proton mask comprising a 10 um thick patterned polyimide layer 58 on top of the silicon nitride capacitor dielectric layer 56 is provided. The polyimide layer 58 is spun on, then soft baked at a temperature of 90° C. A conventional photoresist layer 60 is spun on top of the polyimide layer 58, then patterned. With the polyimide layer 58 left in an uncured state, the photoresist developer consumes the exposed polyimide layer 58 down to the capacitor dielectric layer 56, thereby leaving only region 58 occupied by the ACT device 39 covered with the layer 56, as best shown in FIG. 7A.

The next step is a 300 keV H+ implant at a dose of $1.0\times10^{12}/cm^2$, as best shown in FIG. 7A. This implant, referred to as the "soft proton isolation" (SPI), eliminates the conductivity of the lightly doped epitaxial material 12 in a region 62 under the IFET 35 and the resistor 37. The IFET n-channel layer 28 and the p-resistor layer 20 are advantageously left largely intact due to their heavier doping and the vertical selectivity of the SPI process. This step provides a barrier for the IFET 35 to pinch off against and eliminates the capacitively-coupled parasitic conductive layer below these integrated circuit elements. The SPI mask has a low resolution (about 20 um) compared to the RIE etched process discloses in FIG. 4B. Since the only purpose of the mask is to protect the ACT device 39 from proton exposure, the high resolution process is usually not required. The polyimide layer 58 is removed by conventional techniques.

The deposition of the top capacitor metal 64, patterned by conventional lift-off lithography is disclosed in FIG. 7B. The deposition is done by sequential thermal or electron beam evaporation of 10 nm of Ti followed by 200 nm of Al:Cu (4.5% Cu), done in one high vacuum pump-down. This metalization serves as the top plate of a MIM capacitor 63, in which the thin capacitor dielectric 56 is sandwiched between the top capacitor metal 64 and the Schottky metal 65. The metal 64 can also serve as an additional level of interconnect to route signals, since the metal 64 is contacted by the metal-2 layer described below, although the metal 64 does not make contact to the first level of Schottky metal 65.

A two-level deposition of dielectrics is disclosed in FIG. 8A. First, a 50 nm PECVD silicon oxynitride layer 66 is deposited over the capacitor dielectric layer 56. The layer 66 is used as a silicon nitride etch stop later in the process. A second layer is a 573 nm PECVD silicon nitride layer 68, which is used as the main intermetal dielectric layer in the integrated circuit.

Via holes 70 and 72 are etched on the intermetal dielectric layers 66 and 68, as best shown in FIG. 8B. This is accomplished by patterning the via mask by conventional photolithography, then RIE etching through the dielectric layers 56, 66 and 68 to the respective metal layers. The RIE etch, based on a $CHF_3:O_2$ chemistry, vertically etches the silicon nitride layer 68 and the silicon oxynitride 66 layer and creates the vias 70 and 72 that stop on the capacitor metal or the Schottky metal, respectively. This etch does not attack aluminum-based metalizations. The photoresist is removed by conventional techniques.

The deposition and etch of the metal-2 layer 74 is disclosed in FIG. 9A. With the via holes 70 and 72 exposed down to the underlying Schottky and capacitor metals, the wafer is subjected to a two step process in a sputtering system. The first step is an ion gun sputter clean in which the wafer is bombarded with Ar ions for a time sufficient to remove about 20 nm of material off the wafer's surface. This is done to remove the native oxide from the surface of the aluminum based Schottky 48 and capacitor metalizations 64. Without this oxide removal, a reliable electrical contact between the metal-2 layer 74 and the underlying metals could not be made.

While still in the vacuum chamber, a 600 nm aluminum film 74 is deposited by sputter deposition onto the intermetal dielectric 68. Sputter deposition is preferred over evaporation at this step due to the better step coverage of the via holes 70 and 72 provided by sputtering techniques. The metal-2 layer 74 is then patterned by conventional photolithography (not shown) and etched using standard aluminum wet etching techniques. The metal-2 layer 74 provides the second level of metal routing and makes electrical contacts 76 and 78 to the Schottky metal and capacitor metal, respectively, through the vias 70 and 72.

The removal of the silicon nitride layer 68 in the ACT device channel 41 is disclosed in FIG. 9B. This "channel etch" is accomplished by patterning the channel region photolithographically, then etching the nitride layer 68 in a $CF_4:O_2$ barrel plasma etch to get down to the silicon oxynitride surface 66. The low ion energy of this etch prevents the silicon oxynitride layer 66 from being etched, which stops the etch from reaching down to the semiconductor surface layer 56 where damage to the metal-semiconductor structures can occur from plasma exposure.

The deposition of a 27 nm PECVD silicon nitride layer 82 to serve as one dielectric for the SAW waveguide is disclosed in FIG. 10A. The material and thickness are chosen to provide the proper acoustic confinement in the ACT channel 41. The waveguide layer 82 is patterned with conventional photolithographic techniques and etched with a $CF_4:O_2$ barrel plasma etch to get down to the silicon oxynitride surface 66 in selected regions 84 in the vicinity of the ACT channel 41.

The deposition of a 100 nm PECVD silicon nitride layer 86 is provided to serve as the final device passivation, as best shown in FIG. 10B. Silicon nitride of that thickness is chosen to be compatible with the SAW waveguide and to provide a measure of scratch and contamination protection to the device. The passivation layer 86 is patterned with conventional photolithographic techniques and is etched in a $CF_4:O_2$ barrel plasma etch to get down to the metal-2 layer 74 in selected areas 88 of the circuit to provide bonding pads for external electrical contact. The etch does not attack the aluminum metal-2 material 74.

Figure 11:
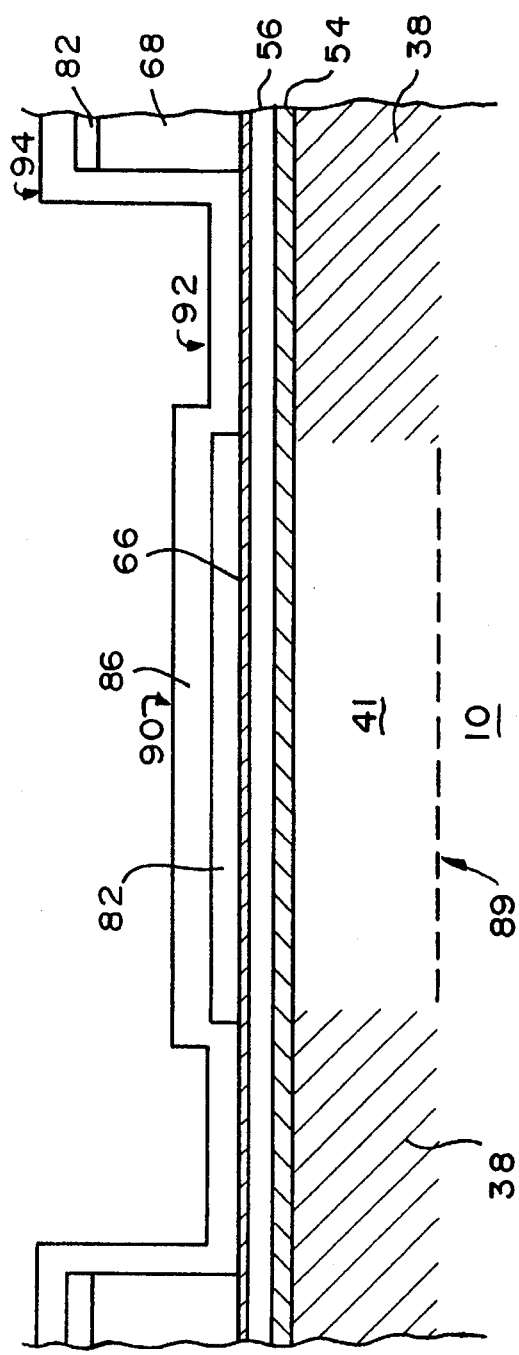
FIG. 11 is an enlarged cross-sectional view taken along line 11—11 in FIG. 10$b$ showing a three-velocity acoustic waveguide.

At this point in the process, a three-velocity SAW waveguide 89 is formed, as best shown in FIG. 11, which is a cross-section taken across the entire acoustic beam in the direction orthogonal to that shown in FIGS. 2–10. The direction of acoustic propagation is into the drawing sheets. Three areas 90, 92 and 94 of different silicon nitride thicknesses corresponding to three different acoustic velocities are disclosed. The active ACT channel 41 is bounded by the semi-insulating substrate 10 on the bottom and hard proton isolated epitaxial GaAs 38 on the sides. An ACT Schottky electrode 54, the capacitor dielectric 56 and the etch stop silicon oxynitride layer 66 are shown extending uniformly across the acoustic beam (not shown). The intermetal nitride 68 is removed from the first and second velocity areas 90 and 92 during the channel etch. The waveguide nitride 82 and a portion of the intermetal nitride 68 is removed from the second velocity area 92 during the waveguide etch. This makes the width of the second velocity area 92 independent of the alignment of the channel etch and waveguide masking steps. The final passivation nitride 86 uniformly covers the entire structure.

Figure 12:
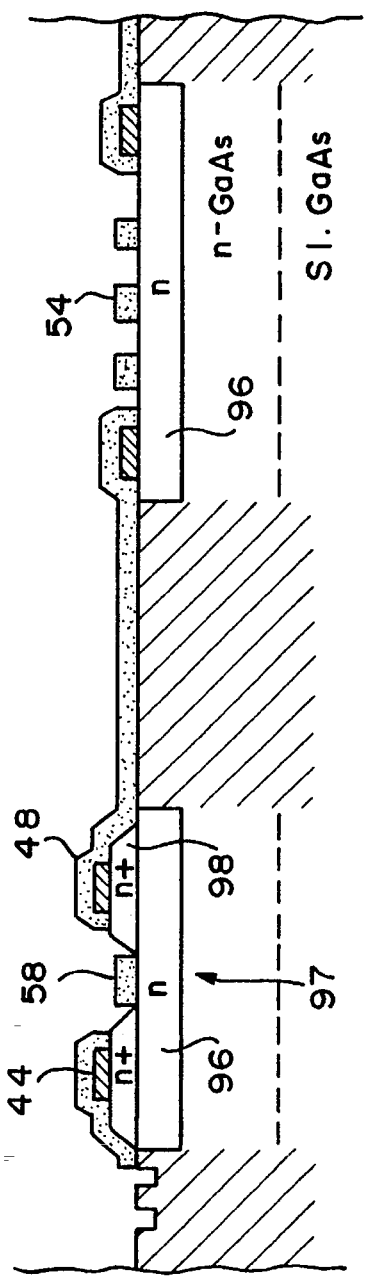
FIG. 12 is a cross-sectional view showing an epitaxially generated isolated field effect transistor (IFET) layer.

A variant of the IFET integration with the IFET n layer 96 and n+ layer 98 grown epitaxially on top of the ACT epitaxial layer is disclosed in FIG. 12. A n+ layer 98 is etched away from all areas except the source and drain of an IFET 97 by conventional "mesa" etch techniques. Ohmic contacts 44 and Schottky contacts 48, 50, 54 are made in the same way as in the implanted process. The advantage of this structure is that active implants are not required and the degradation of the electrical characteristics of the ACT epitaxial layer 12 during the activation anneal is avoided. However, the epitaxial layer 12 is more complex to grow with the addition of two new doped levels 96 and 98 and implanted p-resistors are not easily implemented.

A variant of the soft proton isolation mask from FIG. 7A that has the same resolution as the hard proton isolation mask shown in FIG. 4B is disclosed in FIG. 13 and is based on the RIE process of the hard proton isolation mask. First a 50 nm layer 99 of aluminum is evaporated onto the surface. Then a 10 um of polyimide layer 102 is spun onto the wafers and partially cured. A 200 nm aluminum layer 100 is patterned on top of the polyimide layer 102 by conventional liftoff techniques. The polyimide layer 102 is then etched in a RIE process with an $O_2$ chemistry. The etch stops on the base aluminum layer 99, preventing any sputtering or radiation damage of the underlying capacitor dielectric 56. The entire mask, including the two aluminum layers, is stripped in hot caustic.

A variant of the p-resistor structure that eliminates the need for a p-ohmic metalization is disclosed in FIG. 14. In this case, the p+ implant 24 is done with a Mg+ implant at 100 keV with a dose above $1.0 \times 10^{14}/cm^2$. The use of this high dose of magnesium allows a high surface doping to be achieved and the potential barrier between the Schottky metal 104 and the p+ implant 24 is so low that an effective ohmic contact is obtained.

Figure 15:
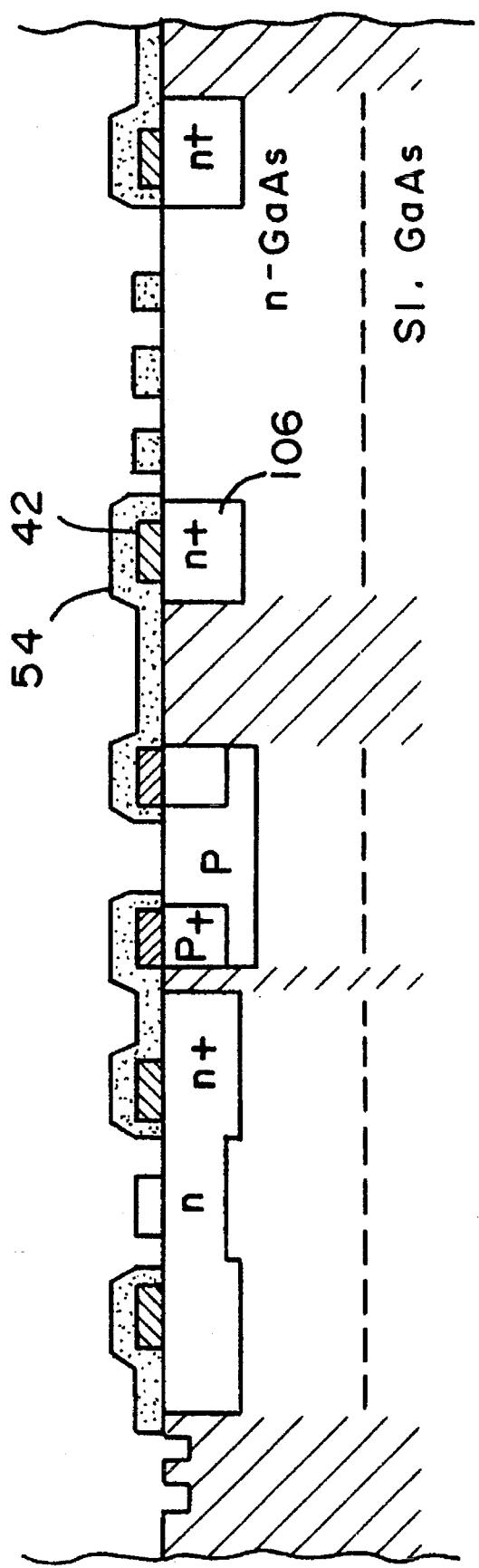
FIG. 15 is a cross-sectional view showing a n+ implant placed under the ACT ohmic contact.

To improve the contact resistance of the input and output contacts of the ACT device 39, the area under the ACT device ohmic contacts 42 can be implanted with n+ implants 106, as best shown FIG. 15. The n+ implants 106 are placed under the ACT ohmic contact.

In both the p-resistor, shown in FIG. 2B and the p+, shown in FIG. 3A, implants Mg can be substituted for Be with the appropriate adjustments in implant energy and dose to produce the same results.

In both the n-channel, shown in FIG. 3B and the n+, shown in FIG. 4B, implants Se can be substituted for Si with the appropriate adjustments in implant energy and dose to produce the same results.

With the basic components of the ACTIC process, one of ordinary skill in the art will understand that there are many other components that are possible, such as:

Schottky barrier diodes are made by placing Schottky metal on an n-channel layer;

P-N junction diodes can be made by doing the n-channel implant into a p-resistor area and making contact to both types of material;

A resistor with a sheet resistance about one tenth that of the p-resistors can be made by contacting two ends of an n-channel layer;

The ability to integrate on a single GaAs chip the ACT device and conventional electronic components such as FETs, diodes, capacitors and resistors.

The present invention has many features that are all compatible with each other in the integrated process. For example:

The IFET, where an insulating barrier is generated below a MESFET structure in a lightly doped epitaxial layer by vertically selective carrier removal with high energy protons.

Implanted p-resistors utilize the low mobility of p-type GaAs to produce a resistor component in the area of 20 kohm/square.

Integrated acoustic waveguide: Using the silicon nitride and GaAs materials already found in a basic ACT structure, constructing a SAW waveguide for significant reduction in power and die size. Producing a structure with a multilevel nitride that is alignment insensitive and prevents etch damage from occurring on the surface of the ACT device by the use of an etch stop. This structure also "shares" the intermetal dielectric and the passivation dielectric in its structure thereby reducing the amount of processing needed to realize all these structures.

Integrated SAW absorbers: Using etched grooves in the GaAs to convert the unused SAW power at the end of the ACT device into bulk acoustic waves and using that layer as the alignment fiducial realizing two functions at the same time.

Using high energy proton isolation as a global component isolation scheme on a thick, lightly doped epitaxial substrate.

Retaining the electrical characteristics of the epitaxial layer after a high temperature ion implant activation anneal.

Doing a shallow surface etch an the epitaxial surface to remove contamination before depositing a cap to provide uniform ion implant activation and to improve the lightly doped epitaxial material survival during the high temperature anneal.

One option over the IFET concept would be to electrically isolate the MESFET from the lightly doped epitaxial layer with a p-doped tub. The disadvantage of this approach is that parasitic capacitance of the p-layer below the MESFET and the epitaxial layer below the p-layer severely degrades the high frequency performance of the MESFET.

A number of the unit processes described above are well established in the literature. These areas include proton isolation of GaAs, polyimide masking of implantation, silicon nitride for implant and anneal cap, silicon and beryllium implants and activation in GaAs, Pd/Ge n-ohmic contacts, Au/Zn/Au p-ohmic contacts, reactive ion etching of GaAs, polyimide and silicon nitride, and use of silicon nitride as a capacitor dielectric. However, there are no established or existing practices for building ACTICs as disclosed herein.

While this invention has been described as having preferred design, it is understood that it is capable of further modification, uses and/or adaptations of the invention following in general the principle of the invention and including such departures from the present disclosure as come within known or customary practice in the art to which the invention pertains, and as may be applied to the essential features set forth, and fall within the scope of the invention or the limits of the appended claims.

We claim:

1. A process for fabricating an acoustic charge transport (ACT) integrated circuit, comprising the steps of:
   a) providing a semi-insulating wafer;
   b) providing an epitaxial layer with a thickness and carrier concentration appropriate for an ACT device on the semi-insulating wafer;
   c) providing at least one circuit element semiconductor layer on the surface of the epitaxial layer for construction of an integrated circuit element, the at least one semiconductor layer having a thickness substantially less than the thickness of the ACT epitaxial layer and having a carrier concentration substantially greater than the ACT epitaxial layer;
   d) removing lateral conductivity of the entire ACT epitaxial layer except in the regions associated with the at least one circuit element semiconductor layer and the ACT device in order to achieve lateral electrical isolation between the circuit element semiconductor layer and the ACT device;
   e) providing ohmic contacts on the at least one layer and on the ACT device;
   f) providing a first metal layer on selected areas on the at least one layer and the ACT device;
   g) rendering semi-insulating the epitaxial layer underneath the at least one layer to provide significant vertical electrical isolation with minimal detrimental effect on the electrical characteristics of the circuit element to be constructed on the semiconductor layer; and
   h) providing at least one layer of dielectric material on the wafer; and
   i) providing at least a second metal layer connected at selected areas to the first metal layer.

2. A process as in claim 1, wherein:
   a) said providing a semi-insulating wafer is implemented with gallium arsenide.

3. A process as in claim 1, and including the steps of:
   a) solvent cleaning the epitaxial layer;
   b) etching the epitaxial layer; and
   c) depositing a first dielectric layer on the epitaxial layer.

4. A process as in claim 3, wherein:
   a) said providing a semi-insulating layer is implemented with gallium arsenide; and
   b) said depositing a first dielectric layer is implemented with silicon nitride.

5. A process as in claim 4, wherein:
   a) said etching the epitaxial layer is implemented with $H_2O:H_2SO_4:H_2O$ solution substantially at 0° C. after said solvent cleaning.

6. A process as in claim 3, wherein said step of providing the at least one semiconductor layer comprises the steps of:
   a) masked implanting a dopant ion layer below the first dielectric layer;
   b) forming a dopant ion contact implant into the dopant ion layer; and
   c) annealing the wafer.

7. A process as in claim 6, wherein:
   a) said steps of implanting and forming each includes the step of bombarding with Be+ ions.

8. A process as in claim 7, wherein:
   a) said providing the first dielectric layer is implemented with silicon nitride;
   b) choosing the energy and dose of the Be+ ions for said implanting substantially at 90 Kev and $1.5$–$6.0 \times 10^{12}/cm^2$, respectively; and c) choosing the energy and dose of the Be+ ions for said forming substantially at 90 Kev and $3.0 \times 10^{13}/cm^2$, respectively.

9. A process as in claim 8, wherein:
a) said annealing the wafer is implemented substantially at 850° C. for 15 secs. in a 10:90 $H_2:N_2$ atmosphere.

10. A process as in claim 8, and including the step of:
a) varying the Be+ ions implant dose to provide higher resistance values.

11. A process as in claim 6, wherein:
a) said steps of implanting and forming each includes the step of implanting with Si+ ions.

12. A process as in claim 11, wherein:
a) said step of providing the first dielectric layer is implemented with silicon nitride;
b) choosing the energy and dose of the Si+ ions for said implanting substantially at 20 Kev and $4.0-4.5 \times 10^{12}/cm^2$, respectively; and
c) choosing the energy and dose of the Si+ ions for said forming substantially at 180 Kev and $2.8 \times 10^{13}/cm^2$, respectively.

13. A process as in claim 12, wherein:
a) said annealing the wafer is implemented substantially at 850° C. for 15 secs. in a 10:90 $H_2:N_2$ atmosphere.

14. A process as in claim 13, wherein said step of removing the lateral conductivity includes the step of:
a) providing a mask for areas occupied by the at least one layer and the ACT device;
b) bombarding the wafer with H+ ions; and
c) stripping the mask.

15. A process as in claim 14, wherein said step of providing the mask comprises the steps of:
a) providing a patterned polyimide film over the wafer.

16. A process as in claim 15, wherein:
a) said providing a semi-insulating layer is implemented with gallium arsenide;
b) said depositing a first dielectric layer is implemented with silicon nitride; and
c) choosing the energy and dose of the H+ ions substantially at 300 Kev and $1.0 \times 10^{14}/cm^2$, respectively.

17. A process as in claim 16, wherein:
a) said stripping the mask is implemented with hot $KOH:H_2O$ solution.

18. A process as in claim 17, and including the step of:
a) removing the silicon nitride layer.

19. A process as in claim 6, wherein said step of providing ohmic contacts includes the steps of:
a) removing the first dielectric layer; and
b) depositing ohmic metal on the at least one layer.

20. A process as in claim 19, wherein:
a) said depositing ohmic metal is implemented with sequential deposition of Pd followed by Ge on an n-type implanted layer; and
b) alloying the deposited metals substantially at 450° C. for 7 min. in a 10:90 $H_2:N_2$ atmosphere.

21. A process as in claim 19, wherein said step of providing ohmic contacts includes the steps of:

a) said depositing ohmic metal is implemented with sequential deposition of Au, followed by Zn, followed by Au on a p-type implanted layer; and
b) alloying the deposited metals substantially at 450° C. for 7 min. in a 10:90 $H_2:N_2$ atmosphere.

22. A process as in claim 1, wherein said step of providing the first metal layer comprises the steps of:
a) depositing Ti followed by 94.5:4.5 Al:Cu on selected areas on the wafer.

23. A process as in claim 1, wherein said step of rendering semi-insulating underneath the at least one layer comprises the steps of:
a) depositing a dielectric layer on the wafer;
b) providing a mask on top of the dielectric layer; and
c) bombarding the wafer with H+ ions.

24. A process as in claim 23, wherein
a) said providing the dielectric layer is implemented with silicon nitride;
b) providing a polyimide layer on top of the wafer; and
c) patterning the polyimide layer.

25. A process as in claim 24, and including the step of:
a) said providing a semi-insulating wafer is implemented with gallium arsenide; and
b) choosing the energy and dose of the H+ ions for said bombarding substantially at 300 Kev and $1.0 \times 10^{12}/cm^2$, respectively 26. A process as in claim 1, wherein:
a) said providing the at least second metal layer is implemented with a capacitor metal.

27. A process as in claim 26, wherein:
a) depositing capacitor metal on a selected area of the silicon nitride layer;
b) providing second and third dielectric materials disposed in successive layers on the wafer;
c) providing via holes at selected areas through the second and third dielectric materials to the first metal layer and the capacitor metal;
d) depositing an interconnect metal layer on the wafer; and
e) patterning the interconnect metal layer; and
f) providing a final passivation layer.

28. A process as in claim 27, wherein:
a) said depositing capacitor metal is implemented with depositing Ti followed by Al:Cu (4.5% Cu) on the first dielectric layer.

29. A process as in claim 27, wherein:
a) said depositing the second and third dielectric layers is implemented with silicon oxynitride and silicon nitride, respectively.

30. A process as in claim 27, and including the step of:
a) etching the dielectric layers in selected areas on top of the ACT device.

* * * * *